United States Patent
Yoshida et al.

(10) Patent No.: US 8,803,275 B2
(45) Date of Patent: Aug. 12, 2014

(54) SEMICONDUCTOR DEVICE INCLUDING POWER SEMICONDUCTOR ELEMENT, BRANCH LINE, AND THERMOELECTRIC CONVERSION ELEMENT, AND ELECTRICALLY POWERED VEHICLE

(75) Inventors: Tadafumi Yoshida, Nisshin (JP); Hiroshi Osada, Komaki (JP); Yutaka Yokoi, Seto (JP)

(73) Assignee: Toyota Jidosha Kabushiki Kaisha, Aichi-ken (JP)

( * ) Notice: Subject to any disclaimer, the term of this patent is extended or adjusted under 35 U.S.C. 154(b) by 559 days.

(21) Appl. No.: 12/532,120

(22) PCT Filed: Mar. 12, 2008

(86) PCT No.: PCT/JP2008/055025
§ 371 (c)(1),
(2), (4) Date: Sep. 18, 2009

(87) PCT Pub. No.: WO2008/123083
PCT Pub. Date: Oct. 16, 2008

(65) Prior Publication Data
US 2010/0101878 A1   Apr. 29, 2010

(30) Foreign Application Priority Data
Mar. 23, 2007 (JP) ................. 2007-077471

(51) Int. Cl.
*H01L 31/058* (2006.01)
*H02H 3/22* (2006.01)
(52) U.S. Cl.
USPC ........... 257/467; 257/691; 257/712; 361/111; 361/118

(58) Field of Classification Search
USPC .................. 257/467, 691, 712; 361/111, 118
See application file for complete search history.

(56) References Cited

U.S. PATENT DOCUMENTS 4,935,864 A * 6/1990 Schmidt et al. ............... 363/141
5,569,950 A * 10/1996 Lewis et al. ................... 257/467

(Continued)

FOREIGN PATENT DOCUMENTS

| | | |
|---|---|---|
| JP | 8-031992 A | 2/1996 |
| JP | 08-070070 A | 3/1996 |
| JP | 11-154720 A | 6/1999 |
| JP | 11-214598 A | 8/1999 |

(Continued)

OTHER PUBLICATIONS

Japanese Office Action for corresponding Japanese Patent Application No. 2007-077471 mailed Nov. 2, 2010.

(Continued)

*Primary Examiner* — Thanh V Pham
(74) *Attorney, Agent, or Firm* — Sughrue Mion, PLLC (57) ABSTRACT

A Peltier element is provided so that an electrically conductive plate forming a heat absorbing portion is in close proximity to an insulating layer and an electrically conductive plate forming a heat radiating portion is provided in close proximity to an insulating layer. The Peltier element has one end connected to a branch line branched from a power line, and has the other end electrically connected to an electrode plate. Further, the Peltier element receives from the branch line a portion of electric power supplied to a power transistor, and outputs it to the electrode plate. In other words, the Peltier element uses the portion of the electric power supplied to the power transistor, to absorb heat generated by the power transistor and radiate it toward a heat radiating plate.

9 Claims, 5 Drawing Sheets

(56) References Cited

U.S. PATENT DOCUMENTS

| | | | |
|---|---|---|---|
| 5,690,849 A * | 11/1997 | DeVilbiss et al. | 219/497 |
| 5,740,016 A * | 4/1998 | Dhindsa | 361/704 |
| 5,887,435 A * | 3/1999 | Morton | 62/3.6 |
| 5,895,964 A | 4/1999 | Nakayama | |
| 6,020,671 A * | 2/2000 | Pento et al. | 310/306 |
| 6,173,576 B1 * | 1/2001 | Ishida et al. | 62/3.7 |
| 7,239,497 B2 * | 7/2007 | Pozzuoli | 361/111 |
| 2004/0195649 A1 | 10/2004 | Miura et al. | |
| 2004/0226599 A1 * | 11/2004 | Kondoh | 136/204 |
| 2006/0007614 A1 * | 1/2006 | Pozzuoli et al. | 361/62 |
| 2006/0101829 A1 | 5/2006 | Morand | |

FOREIGN PATENT DOCUMENTS

| | | |
|---|---|---|
| JP | 2000-340723 A | 12/2000 |
| JP | 2003-197837 A | 7/2003 |
| JP | 2002-289752 A | 10/2004 |
| JP | 2004-289947 A | 10/2004 |
| JP | 2005-323455 A | 11/2005 |
| JP | 2006-287112 A | 10/2006 |

OTHER PUBLICATIONS

German Office Action for corresponding German Patent Application No. 11 2008 000 760.8-33 dated Nov. 25, 2010.

* cited by examiner

SEMICONDUCTOR DEVICE INCLUDING POWER SEMICONDUCTOR ELEMENT, BRANCH LINE, AND THERMOELECTRIC CONVERSION ELEMENT, AND ELECTRICALLY POWERED VEHICLE

TECHNICAL FIELD

The present invention relates to a semiconductor device and an electrically powered vehicle, in particular, a technique for cooling a semiconductor device used in an electrically powered vehicle.

BACKGROUND ART

Japanese Patent Laying-Open No. 11-154720 discloses an inverter that is capable of cooling a switching element without using a cooling fan. The inverter includes a switching element and a cooling device for preventing overheat of the switching element. In the inverter, an electronic cooling device constituted by a Peltier element is used as the cooling device.

However, in the inverter disclosed in Japanese Patent Laying-Open No. 11-154720, a power source for the Peltier element needs to be provided in addition to a power source for supplying electric power to the inverter. Further, a dedicated power line needs to be provided to extend from the power source for the Peltier element to the Peltier element, thus preventing simplification of a circuit configuration.

DISCLOSURE OF THE INVENTION

The present invention is made to solve the foregoing problem, and its object is to provide a semiconductor device and an electrically powered vehicle each allowing for simplification of a circuit configuration.

According to the present invention, a semiconductor device includes a power semiconductor element, a branch line, and a thermoelectric conversion element. The branch line is branched from a power line connected to the power semiconductor element. The thermoelectric conversion element is electrically connected between the branch line and a terminal of the power semiconductor element to which the power line is connected, so as to cool the power semiconductor element using a portion of current supplied to the power semiconductor element.

It is preferable that the semiconductor device further include a sealing material integrally sealing the power semiconductor element and the thermoelectric conversion element.

It is preferable that the semiconductor device further include a thermally conductive electrode plate provided in close proximity to the power semiconductor element. The power line is electrically connected to the electrode plate. The thermoelectric conversion element is provided in close proximity to the electrode plate with an insulating layer interposed therebetween and is electrically connected between the branch line and the electrode plate.

It is preferable that the semiconductor device further include a diode provided at the branch line to prevent reverse current from flowing into the thermoelectric conversion element.

Further, according to the present invention, an electrically powered vehicle includes a power storage device, a driving device, and a motor for driving the vehicle. The driving device receives electric power supplied from the power storage device. The motor is driven by the driving device. The driving device includes a plurality of semiconductor devices for converting the electric power between the power storage device and the motor. Each of the plurality of semiconductor devices includes a power semiconductor element, a branch line, and a thermoelectric conversion element. The branch line is branched from a power line connected to the power semiconductor element. The thermoelectric conversion element is electrically connected between the branch line and a terminal of the power semiconductor element to which the power line is connected, so as to cool the power semiconductor element using a portion of current supplied to the power semiconductor element.

It is preferable that each of the plurality of semiconductor devices further include a diode provided at the branch line to prevent regenerative current from flowing into the thermoelectric conversion element upon regenerative braking of the electrically powered vehicle.

In the present invention, the thermoelectric conversion element is electrically connected between the branch line and the terminal of the power semiconductor element to which the power line is connected, and uses the portion of the current supplied to the power semiconductor element in order to cool the power semiconductor element. Hence, it is not necessary to additionally provide a power source dedicated to the thermoelectric conversion element as well as a power line from the dedicated power source to the thermoelectric conversion element. Thus, according to the present invention, the circuit configuration can be simplified.

Further, in the present invention, in response to the current supplied to the power semiconductor element, the heat generation amount of the power semiconductor element and the current supplied to the thermoelectric conversion element are changed. Hence, in response to the heat generation amount of the power semiconductor element, the thermoelectric conversion element's cooling performance is changed. Thus, according to the present invention, the temperature of the power semiconductor element can be stabilized. In addition, a temperature-controlling sensor, a control circuit, or the like for stabilizing the temperature of the power semiconductor element is not required, thus allowing for realization of downsizing and cost reduction of the device.

BEST MODES FOR CARRYING OUT THE INVENTION

Embodiments of the present invention will be described in detail below with reference to figures. Note that the same or equivalent portions in the figures are given the same reference characters and explanation therefor will not be repeated.

First Embodiment

Figure 1:
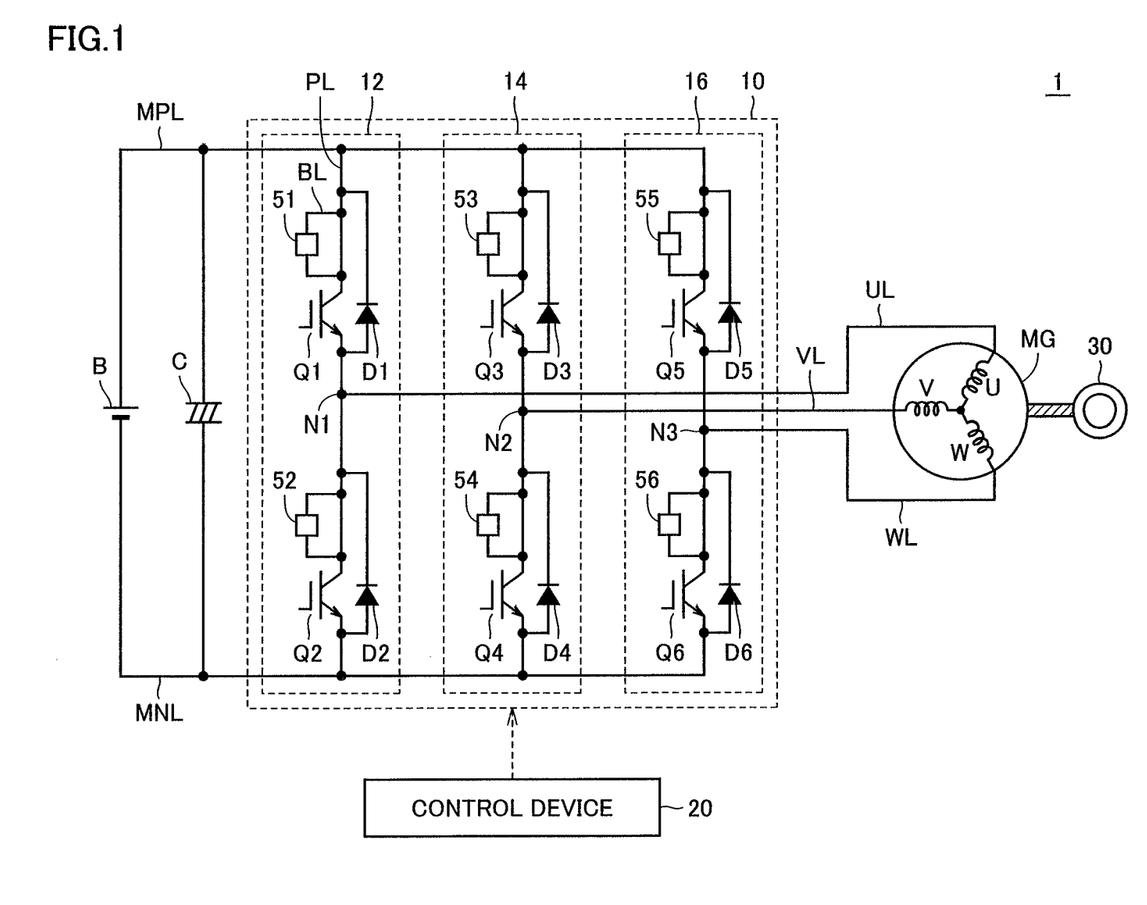
FIG. 1 shows a power train configuration of an electrically powered vehicle to which a semiconductor device according to a first embodiment of the present invention is applied.

FIG. 1 shows a power train configuration of an electrically powered vehicle to which a semiconductor device according to a first embodiment of the present invention is applied. Referring to FIG. 1, electrically powered vehicle 1 includes a power storage device B, a capacitor C, an inverter 10, a motor generator MG, a wheel 30, and a control device 20.

Power storage device B has a positive electrode connected to a positive bus line MPL, and has a negative electrode connected to a negative bus line MNL. Capacitor C is connected between positive bus line MPL and negative bus line MNL. Inverter 10 includes a U-phase arm 12, a V-phase arm 14, and a W-phase arm 16. U-phase arm 12, V-phase arm 14, and W-phase arm 16 are connected in parallel between positive bus line MPL and negative bus line MNL.

U-phase arm 12 includes power transistors Q1, Q2, Peltier elements 51, 52, and diodes D1, D2. Power transistors Q1, Q2 are connected in series between positive bus line MPL and negative bus line MNL. Peltier element 51 is connected, in parallel, to a power line PL that connects the collector of power transistor Q1 to positive bus line MPL. Peltier element 52 is connected, in parallel, to a power line that connects the collector of power transistor Q2 to a node N1 at which the emitter of power transistor Q1 and a U-phase line UL are connected. Diode D1 is connected, in anti-parallel, to a circuit constituted by power transistor Q1 and Peltier element 51. Diode D2 is connected, in anti-parallel, to a circuit constituted by power transistor Q2 and Peltier element 52.

V-phase arm 14 includes power transistors Q3, Q4, Peltier elements 53, 54, and diodes D3, D4. Power transistor Q3, Q4 are connected in series between positive bus line MPL and negative bus line MNL. Peltier element 53 is connected, in parallel, to a power line that connects the collector of power transistor Q3 to positive bus line MPL. Peltier element 54 is connected, in parallel, to a power line that connects the collector of power transistor Q4 to a node N2 at which the emitter of power transistor Q3 and a V-phase line VL are connected. Diode D3 is connected, in anti-parallel, to a circuit constituted by power transistor Q3 and Peltier element 53. Diode D4 is connected, in anti-parallel, to a circuit constituted by power transistor Q4 and Peltier element 54.

W-phase arm 16 includes power transistors Q5, Q6, Peltier elements 55, 56, and diodes D5, D6. Power transistors Q5, Q6 are connected in series between positive bus line MPL and negative bus line MNL. Peltier element 55 is connected, in parallel, to a power line that connects the collector of power transistor Q5 to positive bus line MPL. Peltier element 56 is connected, in parallel, to a power line that connects the collector of power transistor Q6 to a node N3 at which the emitter of power transistor Q5 and a W-phase line WL are connected. Diode D5 is connected, in anti-parallel, to a circuit constituted by power transistor Q5 and Peltier element 55. Diode D6 is connected, in anti-parallel, to a circuit constituted by power transistor Q6 and Peltier element 56.

It should be noted that, as each of the above-described power transistors, an IGBT (Insulated Gate Bipolar Transistor), a power MOSFET (Metal Oxide Semiconductor Field-Effect Transistor), or the like can be used, for example.

Motor generator MG includes a U-phase coil U, a V-phase coil V, and a W-phase coil W as stator coils. U-phase coil U, V-phase coil V, and W-phase coil W are connected to node N1 of U-phase arm 12, node N2 of V-phase arm 14, and node N3 of W-phase arm 16 via U-phase line UL, V-phase line VL, and W-phase line WL, respectively.

Power storage device B is a chargeable direct-current power source, and is constituted by, for example, a secondary battery such as a nickel hydrogen battery or a lithium ion battery. Power storage device B supplies electric power to inverter 10, and receives from inverter 10 regenerative electric power generated upon regenerative braking of the vehicle and is charged accordingly. It should be noted that a capacitor having a large capacitance may be used as power storage device B.

Capacitor C reduces a fluctuating component in voltage between positive bus line MPL and negative bus line MNL. Inverter 10 converts the direct-current voltage received from power storage device B into three-phase alternating current voltage based on a control signal from control device 20, and sends it to motor generator MG. Further, inverter 10 converts three-phase alternating current voltage, generated by motor generator MG using torque of wheel 30 upon regenerative braking of the vehicle, into direct-current voltage, and outputs it to positive bus line MPL and negative bus line MNL.

Here, Peltier element 51 uses a portion of current supplied from positive bus line MPL to power transistor Q1, in order to cool power transistor Q1. Namely, Peltier element 51 is connected between branch line BL branched from power line PL that connects the collector of power transistor Q1 to positive bus line MPL and the collector of power transistor Q1, and cools power transistor Q1 using current diverted from power line PL to branch line BL. Likewise, Peltier elements 52-56 use portions of current supplied to power transistors Q2-Q6, in order to cool power transistors Q2-Q6, respectively.

Motor generator MG is a three-phase alternating current rotating electrical machine, and is constituted by, for example, a three-phase permanent magnet synchronous motor having a permanent magnet in its rotor. Motor generator MG is driven by inverter 10 in a power running mode to generate driving force for driving wheel 30. On the other hand, motor generator MG is driven by inverter 10 in a regenerative mode upon regenerative braking of the vehicle, and outputs to inverter 10 three-phase alternating current electric power generated using torque of wheel 30.

Based on a torque command value, a rotational position and a rotational speed of the rotor, motor current, voltage across capacitor C, and the like in motor generator MG, control device 20 generates a control signal to drive motor generator MG and sends the generated control signal to each of power transistors Q1-Q6 of inverter 10.

Figure 2:
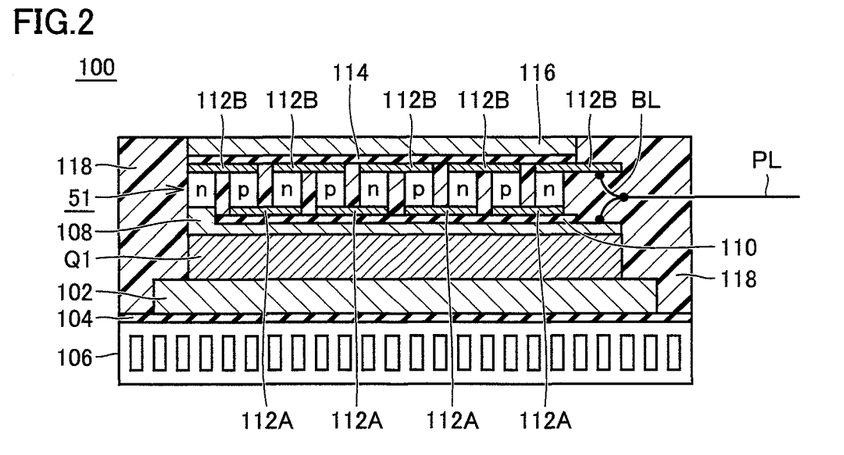
FIG. 2 is an explanatory diagram of a structure of the semiconductor device forming a power transistor and a Peltier element in a U-phase arm shown in FIG. 1.

FIG. 2 is an explanatory diagram of a structure of a semiconductor device forming power transistor Q1 and Peltier element 51 in U-phase arm 12 shown in FIG. 1. It should be noted that a semiconductor device forming a power transistor and a Peltier element in each of the lower arm of U-phase arm 12 and the upper and lower arms of V, W-phase arms 14, 16 has a structure similar to that of the semiconductor device described below.

Referring to FIG. 2, semiconductor device 100 includes power transistor Q1, electrode plates 102, 108, insulating layers 104, 110, 114, a cooler 106, Peltier element 51, a heat radiating plate 116, and a molding resin 118.

Power transistor Q1 is provided between electrode plate 102 and electrode plate 108. Electrode plate 102 is constituted by a conductor having good electric conductivity and heat conductivity, and is made of, for example, copper. Electrode plate 102 forms an electrode connected to the emitter of power transistor Q1, and also serves as a heat conducting plate that conducts heat generated by power transistor Q1 to cooler 106.

Insulating layer 104 is provided between electrode plate 102 and cooler 106. Insulating layer 104 electrically insulates electrode plate 102 from cooler 106 and conducts the heat from electrode plate 102 to cooler 106. Cooler 106 is constituted by a member with good heat conductivity, and is made of for example, aluminum.

Electrode plate 108 forms an electrode connected to the collector of power transistor Q1, and also serves as a heat conducting plate that conducts the heat generated by power transistor Q1 to Peltier element 51. Electrode plate 108 is electrically connected to power line PL connected to positive bus line MPL, and is also electrically connected to Peltier element 51 electrically connected to branch line BL branched from power line PL. Insulating layer 110 is provided between electrode plate 108 and Peltier element 51. Insulating layer 110 electrically insulates a heat absorbing surface of Peltier element 51 from electrode plate 108, and conducts the heat from electrode plate 108 to Peltier element 51.

Peltier element 51 is provided between insulating layers 110, 114. Peltier element 51 is disposed so that electrically conductive plates 112A forming n→p junctions (heat absorbing portions) are in close proximity to insulating layer 110 and electrically conductive plates 112B forming p→n junctions (heat radiating portions) are in close proximity to insulating layer 114. Further, Peltier element 51 has one end connected to branch line BL branched from power line PL, and has the other end electrically connected to electrode plate 108. From branch line BL, Peltier element 51 receives a portion of electric power supplied to power transistor Q1 and outputs it to electrode plate 108. In other words, Peltier element 51 uses a portion of electric power supplied to power transistor Q1, in order to absorb heat generated by power transistor Q1, and radiates the heat toward heat radiating plate 116. A heat absorption amount Q of Peltier element 51 is expressed by the following formula:

$$\text{Heat absorption amount } Q = (\alpha p - \alpha n) \times Tc \times I - Qj - Q\lambda \quad (1)$$

Here, $\alpha p$, $\alpha n$ represent Seebeck coefficients, $Tc$ represents a temperature in a cooled portion, $I$ represents current, $Qj$ represents loss resulting from Joule heat, and $Q\lambda$ represents loss resulting from heat conduction. As seen from formula (I), heat absorption amount Q is in proportion to current I. Namely, heat absorption amount Q is in proportion to current supplied from power line PL to power transistor Q1.

Note that Peltier element 51 may be a sintered-compact element or an element in the form of a thin or thick film.

Insulating layer 114 is provided between Peltier element 51 and heat radiating plate 116. Insulating layer 114 electrically insulates Peltier element 51 from heat radiating plate 116 and conducts the heat, emitted from Peltier element 51, to heat radiating plate 116. Heat radiating plate 116 is constituted by a member with good heat conductivity, and is made of, for example, aluminum. Heat radiating plate 116 radiates the heat, emitted from Peltier element 51, to the outside of semiconductor device 100.

Molding resin 118 is made of, for example, an epoxy resin, and fixes and seals power transistor Q1, electrode plates 102, 108, Peltier element 51, and heat radiating plate 116 integrally.

In semiconductor device 100, cooler 106 cools one surface of power transistor Q1 and Peltier element 51 cools the other surface thereof. Peltier element 51 is electrically connected between branch line BL branched from power line PL connected to positive bus line MPL and electrode plate 108, and cools power transistor Q1 using a portion of electric power supplied from power line PL to power transistor Q1.

Specifically, Peltier element 51 is not supplied with electric power from a dedicated power source but operates using a portion of electric power supplied to power transistor Q1. As the electric power supplied to power transistor Q1 is greater, the electric power supplied to Peltier element 51 is greater. As the electric power supplied to power transistor Q1 is greater, the heat generation amount of power transistor Q1 is increased. Hence, in response to the increase in the heat generation amount of power transistor Q1, cooling performance of Peltier element 51 is increased. As such, semiconductor device 100 has a self cooling-controllability allowing the cooling performance of Peltier element 51 to change in response to change in heat generation of power transistor Q1.

As described above, in the first embodiment, the Peltier element is electrically connected between branch line BL and the collector of the power transistor, and cools the power transistor using a portion of current supplied to the power transistor. Hence, it is not necessary to additionally provide a power source dedicated to the Peltier element as well as a power line from the dedicated power source to the Peltier element. Thus, according to the first embodiment, the circuit configuration can be simplified.

In addition, in the first embodiment, the current supplied to the Peltier element is changed in response to the current supplied to the power transistor, so the Peltier element's cooling performance is changed in response to the heat generation amount of the power transistor. Hence, according to the first embodiment, the temperature of the power transistor can be stabilized. Hence, a temperature control sensor, a control circuit, and the like for stabilizing the temperature of the power transistor are not required, thus achieving realization of downsizing and cost reduction of the semiconductor device.

Second Embodiment

Figure 3:
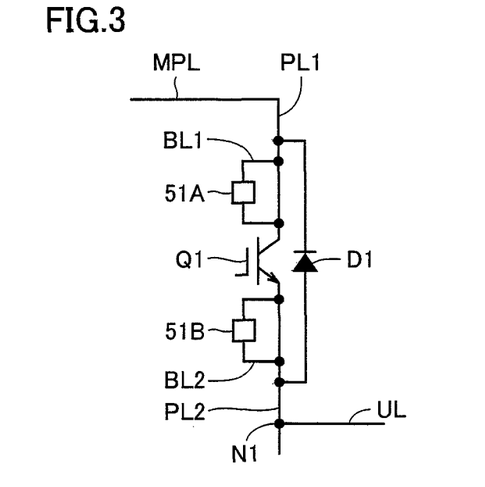
FIG. 3 is a circuit diagram of the upper arm of a U-phase arm of an inverter in a second embodiment.

FIG. 3 is a circuit diagram of an upper arm of a U-phase arm of an inverter in a second embodiment. It should be noted that each of the other upper and lower arms has a configuration similar to that of the below-described upper arm of the U-phase arm.

Referring to FIG. 3, the upper arm of the U-phase arm includes a power transistor Q1, Peltier elements 51A, 51B, and a diode D1. Peltier element 51A is connected, in parallel, to a power line PL1 that connects the collector of power transistor Q1 to a positive bus line MPL. Peltier element 51B is connected, in parallel, to a power line PL2 that connects the emitter of power transistor Q1 to a node N1. Diode D1 is connected, in anti-parallel, to a circuit constituted by power transistor Q1 and Peltier elements 51A, 51B.

It should be noted that the other configurations of the electrically powered vehicle in the second embodiment are the same as those of electrically powered vehicle 1 of the first embodiment shown in FIG. 1.

Figure 4:
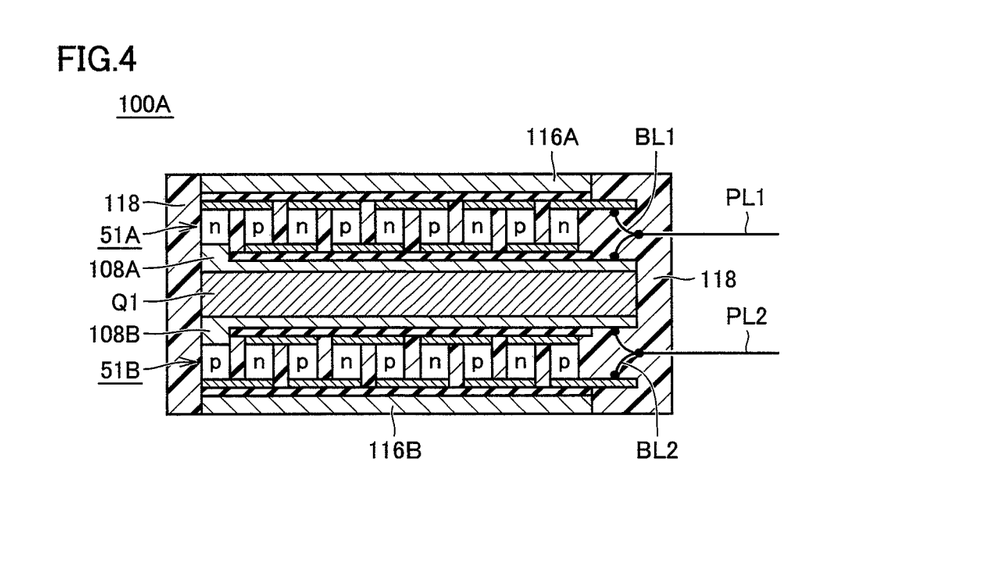
FIG. 4 is an explanatory diagram of a structure of a semiconductor device forming a power transistor and a Peltier element in the upper arm of an U-phase arm shown in FIG. 3.

FIG. 4 is an explanatory diagram of a structure of a semiconductor device forming power transistor Q1 and Peltier elements 51A, 51B in the upper arm of the U-phase arm shown in FIG. 3. Note that a semiconductor device forming a power transistor and Peltier elements in each of the lower arm of the U-phase arm and the upper and lower arms of the V, W-phase arms has a structure similar to that of the semiconductor device described below.

Referring to FIG. 4, semiconductor device 100A includes power transistor Q1, electrode plates 108A, 108B, Peltier elements 51A, 51B, heat radiating plates 116A, 116B, and a molding resin 118.

Power transistor Q1 is provided between electrode plate 108A and electrode plate 108B. Configurations of electrode plate 108A, Peltier element 51A, and heat radiating plate 116A are similar to those of electrode plate 108, Peltier element 51, and heat radiating plate 116 of semiconductor device 100 shown in FIG. 2, respectively.

Electrode plate 108B forms an electrode connected to the emitter of power transistor Q1, and serves as a heat conducting plate for conducting heat generated by power transistor Q1 to Peltier element 51B. Electrode plate 108B is electrically connected to a power line PL2 (FIG. 3) connected to node N1 and is also electrically connected to Peltier element 51B electrically connected to a branch line BL2 branched from power line PL2.

Peltier element 51B is disposed so that an electrically conductive plate forming n→p junctions (heat absorbing portions) is in close proximity to an insulating layer of the electrode plate 108B side and an electrically conductive plate forming p→n junctions (heat radiating portions) is in close proximity to an insulating layer of the heat radiating plate 116B side. Peltier element 51B has one end electrically connected to electrode plate 108B, and has the other end connected to branch line BL2 branched from power line PL2. Peltier element 51B receives a portion of electric power sent from power transistor Q1 to electrode plate 108B, and outputs it to branch line BL2. Namely, Peltier element 51B uses a portion of electric power supplied from power transistor Q1, in order to absorb the heat generated by power transistor Q1 and radiate it toward heat radiating plate 116B.

It should be noted that each of Peltier elements 51A, 51B may be a sintered-compact element or an element in the form of a thin or thick film.

Molding resin 118 fixes and seals power transistor Q1, electrode plates 108A, 108B, Peltier elements 51A, 51B, and heat radiating plates 116A, 116B integrally.

In semiconductor device 100A, Peltier element 51A cools one surface of power transistor Q1 and Peltier element 51B cools the other surface thereof. Peltier element 51A is electrically connected between branch line BL1 branched from power line PL1 connected to positive bus line MPL and electrode plate 108A. Peltier element 51A thus connected uses a portion of electric power supplied from power line PL1 to power transistor Q1, in order to cool power transistor Q1. Further, Peltier element 51B is electrically connected between branch line BL2 branched from power line PL2 connected to node N1 and electrode plate 108B, and cools power transistor Q1 using a portion of electric power supplied to power transistor Q1.

As described above, according to the second embodiment, an advantage similar to that in the first embodiment can be obtained too.

Third Embodiment

Figure 5:
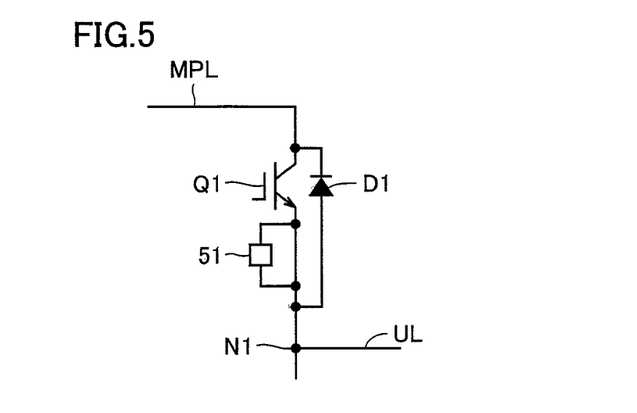
FIG. 5 is a circuit diagram of the upper arm of a U-phase arm of an inverter in a third embodiment.

FIG. 5 is a circuit diagram of an upper arm of an U-phase arm of an inverter in a third embodiment. It should be noted that each of the other upper and lower arms has a configuration similar to that of the below-described upper arm of the U-phase arm.

Referring to FIG. 5, in the third embodiment, Peltier element 51 is connected, in parallel, to a power line that connects the emitter of a power transistor Q1 to a node N1. A diode D1 is connected, in anti-parallel, to a circuit constituted by power transistor Q1 and Peltier element 51.

It should be noted that the other configurations of an electrically powered vehicle in the third embodiment are the same as those of electrically powered vehicle 1 according to the first embodiment shown in FIG. 1.

According to the third embodiment, an advantage similar to that in the first embodiment can be obtained too.

Fourth Embodiment

Figure 6:
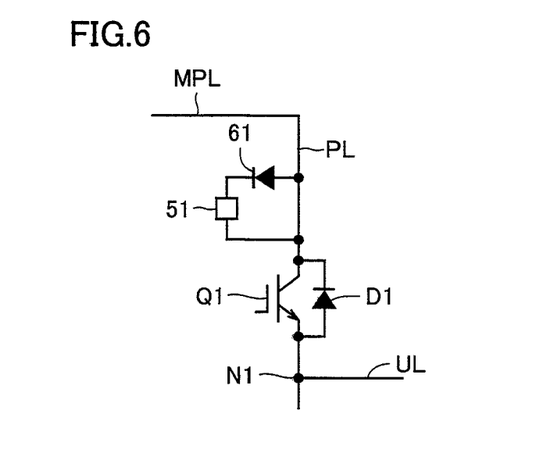
FIG. 6 is a circuit diagram of the upper arm of a U-phase arm of an inverter in a fourth embodiment.

FIG. 6 is a circuit diagram of an upper arm of an U-phase arm of an inverter in a fourth embodiment. It should be noted that each of the other upper and lower arms has a configuration similar to that of the below-described upper arm of the U-phase arm.

Referring to FIG. 6, the upper arm of the U-phase arm includes a power transistor Q1, a Peltier element 51, and diodes D1, 61. Diode D1 is connected to power transistor Q1 in anti-parallel. Diode 61 is provided at a branch line branched from power line PL in order to prevent regenerative current, which flows from a node N1 to a positive bus line MPL via diode D1, from flowing into Peltier element 51.

It should be noted that the other configurations of an electrically powered vehicle in the fourth embodiment are the same as those of electrically powered vehicle 1 in the first embodiment shown in FIG. 1.

In the fourth embodiment, upon regenerative braking of electrically powered vehicle 1, regenerative electric power flows from motor generator MG, passing through U-phase line UL, node N1, and diode D1 in this order, reaching positive bus line MPL. Here, diode 61 prevents the regenerative current from flowing into Peltier element 51, so Peltier element 51 never generates heat upon regenerative braking.

As described above, according to the fourth embodiment, the power transistor can be prevented from being heated upon regenerative braking of the vehicle.

It should be noted that in the first to third embodiments, diode D1 is connected, in anti-parallel, to the circuit constituted by power transistor Q1 and the Peltier element(s), so no regenerative current flows into Peltier element 51.

Fifth Embodiment

Figure 7:
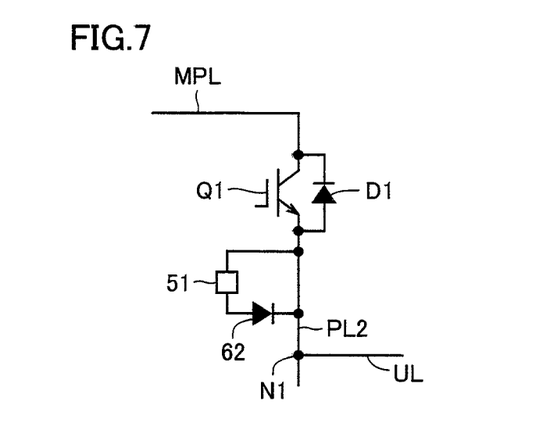
FIG. 7 is a circuit diagram of the upper arm of a U-phase arm of an inverter in a fifth embodiment.

FIG. 7 is a circuit diagram of an upper arm of an U-phase arm of an inverter in a fifth embodiment. It should be noted that each of the other upper and lower arms has a configuration similar to that of the below-described upper arm of the U-phase arm.

Referring to FIG. 7, the upper arm of the U-phase arm includes a power transistor Q1, a Peltier element 51, and diodes D1, 62. Diode D1 is connected to power transistor Q1 in anti-parallel. Diode 62 is provided at a branch line branched from a power line PL2 in order to prevent regenerative current, which flows from a node N1 to a positive bus line MPL via diode D1, from flowing into Peltier element 51.

It should be noted that the other configurations of an electrically powered vehicle in the fifth embodiment are the same as those of electrically powered vehicle 1 according to the first embodiment shown in FIG. 1.

Also in the fifth embodiment, diode 62 prevents regenerative current from flowing into Peltier element 51, so Peltier element 51 never generates heat upon regenerative braking of electrically powered vehicle 1. As such, according to the fifth embodiment, the power transistor can be prevented from being heated upon regenerative braking of the vehicle, too.

It should be noted that in each of the above-described embodiments, to increase efficiency of cooling performed by a Peltier element, a cooling fin may be provided on a heat radiating plate that receives heat radiated from the Peltier element.

Figure 8:
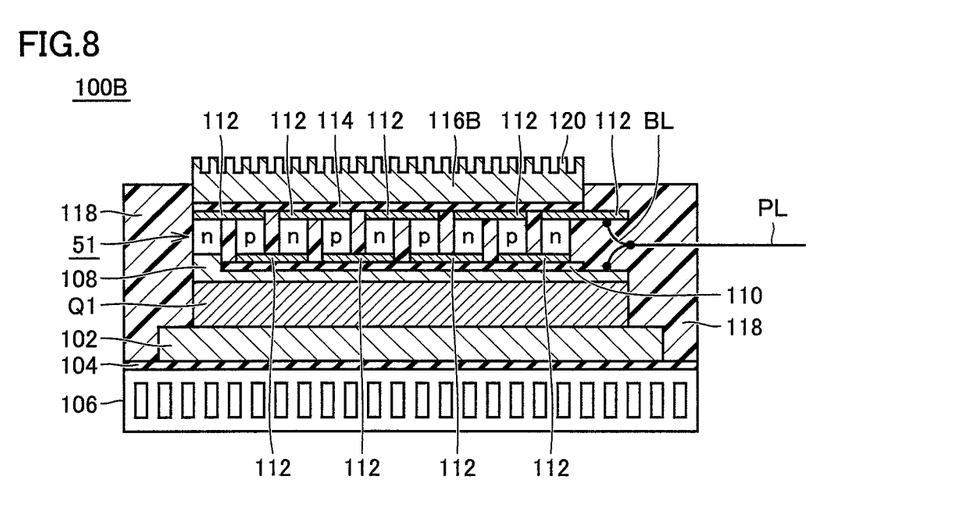
FIG. 8 is an explanatory diagram of another structure of the semiconductor device.

FIG. 8 is an explanatory diagram of another structure of the semiconductor device. Referring to FIG. 8, semiconductor device 100B includes a heat radiating plate 116B instead of heat radiating plate 116 in the configuration of semiconductor device 100 of the first embodiment shown in FIG. 2. Heat radiating plate 116B has a heat radiating surface on which cooling fins 120 are provided. With such a configuration, heat absorbed by Peltier element 51 is efficiently radiated from cooling fins 120 of heat radiating plate 116B to the outside of the device.

Similarly, although not shown in the figures particularly, a cooling fin may be provided on the heat radiating plate in the semiconductor device of each of the second to fifth embodiments.

Further, in each of the above-described embodiments, the electrically powered vehicle may further include an internal combustion engine, and a motor generator capable of generating electric power using kinetic energy from the internal combustion engine and supplying it to power storage device B and inverter 10. In other words, the electrically powered vehicle may be configured as a hybrid vehicle. Further, the electrically powered vehicle may further include a fuel cell capable of supplying electric power to motor generator MG.

Note that in the description above, each of power transistors Q1-Q6 corresponds to a "power semiconductor element" of the present invention, each of Peltier elements 51-56, 51A, 51B corresponds to a "thermoelectric conversion element" of the present invention. Note also that each of diodes 61, 62 corresponds to a "diode" of the present invention, and molding resin 118 corresponds to "sealing material" of the present invention.

It should be considered that the embodiments disclosed herein are illustrative and non-restrictive in any respect. The scope of the present invention is defined by the scope of claims rather than the above description of the embodiments, and is intended to include any modifications within the scope and meaning equivalent to the terms of the claims.

The invention claimed is:

1. A semiconductor device comprising:
a power semiconductor element brought into an on state or an off state in accordance with a given command;
a power line connected to said power semiconductor element;
a branch line branched from the power line such that the branch line is electrically parallel to a part of the power line; and
a thermoelectric conversion element electrically connected between a location where said branch line is connected to the power line and a terminal of said power semiconductor element to which said power line is connected, so as to cool said power semiconductor element using a portion of current supplied to said power semiconductor element.

2. The semiconductor device according to claim 1, further comprising a sealing material integrally sealing said power semiconductor element and said thermoelectric conversion element.

3. The semiconductor device according to claim 1, further comprising a thermally conductive electrode plate provided in close proximity to said power semiconductor element, wherein:
said power line is electrically connected to said electrode plate, and
said thermoelectric conversion element is provided in close proximity to said electrode plate with an insulating layer interposed therebetween and is electrically connected between said branch line and said electrode plate.

4. The semiconductor device according to claim 1, further comprising a diode provided at said branch line to prevent reverse current from flowing into said thermoelectric conversion element.

5. An electrically powered vehicle comprising:
a power storage device;
a driving device receiving electric power supplied from said power storage device; and
a motor driven by said driving device to drive the vehicle,
said driving device including a plurality of semiconductor devices for converting the electric power between said power storage device and said motor,
each of said plurality of semiconductor devices including
power semiconductor element brought into an on state or an off state in accordance with a given command,
a power line connected to said power semiconductor element;
a branch line branched from the power line such that the branch line is electrically parallel to a part of the power line, and
a thermoelectric conversion element electrically connected between a location where said branch line is connected to the power line and a terminal of said power semiconductor element to which said power line is connected, so as to cool said power semiconductor element using a portion of current supplied to said power semiconductor element.

6. The electrically powered vehicle according to claim 5, wherein each of said plurality of semiconductor devices further includes a diode provided at said branch line to prevent regenerative current from flowing into said thermoelectric conversion element upon regenerative braking of the electrically powered vehicle.

7. The semiconductor device according to claim 1, further comprising a diode connected, in anti-parallel, to a circuit constituted by the power semiconductor element and the thermoelectric conversion element to prevent reverse current from flowing into said thermoelectric conversion element.

8. The electrically powered vehicle according to claim 5, wherein each of said plurality of semiconductor devices further includes a diode connected in anti-parallel, to a circuit constituted by the power semiconductor element and the thermoelectric conversion element to prevent reverse current from flowing into said thermoelectric conversion element.

9. The electrically powered vehicle according to claim 1, wherein said power semiconductor element constitutes an inverter.

* * * * *